United States Patent
Kariya et al.

(10) Patent No.: US 11,488,879 B2
(45) Date of Patent: Nov. 1, 2022

(54) METHODS AND APPARATUSES TO WAFER-LEVEL TEST ADJACENT SEMICONDUCTOR DIE

(71) Applicant: Micron Technology, Inc., Boise, ID (US)

(72) Inventors: Rajesh H. Kariya, Boise, ID (US); Boon Hor Lam, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/896,120

(22) Filed: Jun. 8, 2020

(65) Prior Publication Data
US 2021/0202328 A1 Jul. 1, 2021

Related U.S. Application Data

(60) Provisional application No. 62/955,276, filed on Dec. 30, 2019.

(51) Int. Cl.
*G11C 29/38* (2006.01)
*H01L 21/66* (2006.01)

(52) U.S. Cl.
CPC .............. *H01L 22/34* (2013.01); *G11C 29/38* (2013.01); *H01L 22/14* (2013.01)

(58) Field of Classification Search
None
See application file for complete search history.

(56) References Cited

U.S. PATENT DOCUMENTS

| | | | | |
|---|---|---|---|---|
| 5,457,400 A | * | 10/1995 | Ahmad | G01R 31/30 714/E11.169 |
| 5,654,588 A | * | 8/1997 | Dasse | G01R 31/2831 257/204 |
| 5,995,731 A | * | 11/1999 | Crouch | G11C 29/26 716/136 |
| 6,630,685 B1 | * | 10/2003 | Lunde | H01L 22/34 257/691 |
| 6,671,837 B1 | * | 12/2003 | Reohr, Jr. | G11C 29/1201 365/201 |
| 7,173,444 B2 | * | 2/2007 | Pourkeramati | G01R 31/2884 324/750.3 |
| 7,844,867 B1 | * | 11/2010 | Reddy | G11C 29/16 714/733 |

(Continued)

*Primary Examiner* — Tan T. Nguyen
(74) *Attorney, Agent, or Firm* — Dorsey & Whitney LLP

(57) ABSTRACT

Wafer-level testing of multiple adjacent semiconductor die of a semiconductor wafer in parallel using built-in self-test circuitry for a memory (mBIST) and scribe lines that connect certain terminals of a semiconductor die to terminals of an adjacent semiconductor die. During the wafer-level testing, probe needles of a test setup connect to a single one of the multiple adjacent semiconductor die, and mBIST commands are passed from the single one of the multiple adjacent semiconductor die to one or more adjacent semiconductor die. In some examples, the scribe lines connect mBIST circuit terminals of one semiconductor die to mBIST circuit terminals of an adjacent semiconductor die. In some examples, the scribe lines connect I/O terminals of one semiconductor die to I/O terminals of an adjacent semiconductor die. The scribe lines may cross scribe regions of the wafer to connect the respective terminals of the adjacent semiconductor die.

20 Claims, 6 Drawing Sheets

(56) References Cited

U.S. PATENT DOCUMENTS

| | | | | |
|---|---|---|---|---|
| 9,058,126 | B2* | 6/2015 | Bartling | G06F 11/1469 |
| 10,115,477 | B2* | 10/2018 | Tshagharyan | G11C 29/36 |
| 2003/0219913 | A1* | 11/2003 | Pourkeramati | G01R 31/2884 |
| | | | | 438/12 |
| 2004/0049724 | A1* | 3/2004 | Bill | G11C 29/44 |
| | | | | 714/733 |
| 2006/0168491 | A1* | 7/2006 | Lee | G11C 29/16 |
| | | | | 714/733 |
| 2008/0116910 | A1* | 5/2008 | Hung | H03H 7/38 |
| | | | | 324/754.03 |
| 2010/0237891 | A1* | 9/2010 | Lin | G01R 31/2851 |
| | | | | 324/750.3 |
| 2014/0331099 | A1* | 11/2014 | Wong | G01R 31/318547 |
| | | | | 714/733 |
| 2018/0180665 | A1* | 6/2018 | Delacruz | G01R 31/2894 |
| 2019/0066815 | A1* | 2/2019 | Chiu | G11C 29/021 |

* cited by examiner

METHODS AND APPARATUSES TO WAFER-LEVEL TEST ADJACENT SEMICONDUCTOR DIE

CROSS-REFERENCE TO RELATED APPLICATION (S)

This application claims the benefit under 35 U.S.C. § 119 of the earlier filing date of U.S. Provisional Application No. 62/955,276 filed on Dec. 30, 2019. This application is incorporated by reference herein in its entirety and for all purposes.

BACKGROUND

During production, wafer-level testing may include connecting multiple semiconductor devices (e.g., devices or units under test (DUTs)) to test setup in parallel to facilitate contemporaneous testing of the multiple DUTs. The test setup may involve positioning a respective set probe needles or pins to electrically contact respective terminals or pins (e.g., input/output (I/O) terminals, power terminals, etc.) of each DUT. As the size of terminals or pins of each the DUTs continue to become smaller, alignment of the probe needles of the test setup with corresponding terminals or pins of the DUTs may prove more difficult. A misaligned probe needle may contact an incorrect pin or terminal of a DUT, may improperly contemporaneously contact two or more pins of the DUT, may fail to contact any targeted pins of the DUT, or any combination thereof. Testing performed with misaligned probe needles due to a defective test setup may cause the tester to unnecessarily fail the DUE Unnecessarily failing a DUT may reduce yield and production efficiency, as well as increase production costs.

DETAILED DESCRIPTION OF THE EMBODIMENTS

Figure 1:
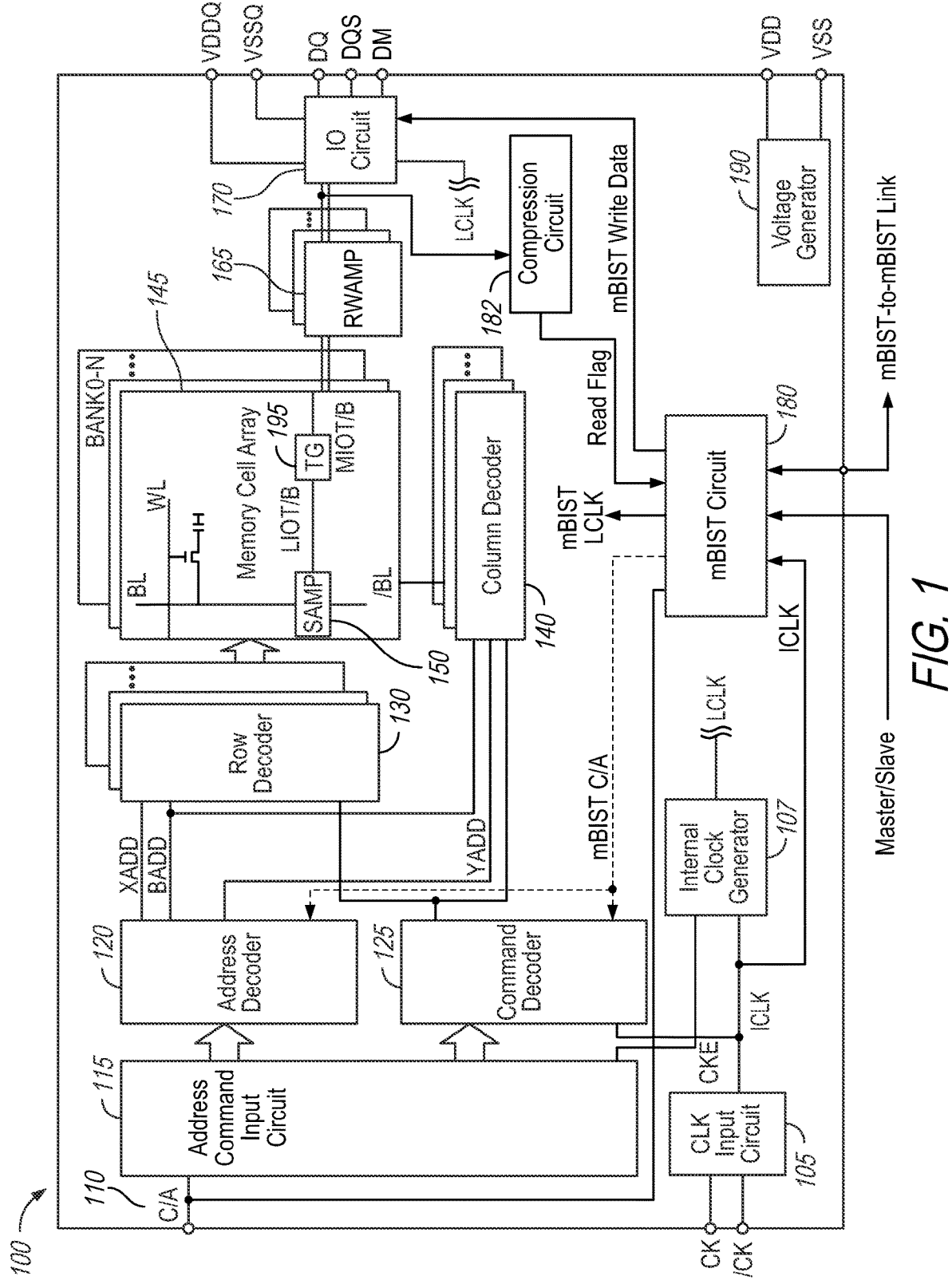
FIG. 1 is a schematic block diagram of a semiconductor die (or device), in accordance with an embodiment of the present disclosure.

Examples described herein include wafer-level testing of multiple adjacent semiconductor die of a semiconductor wafer using built-in self-test circuitry for a memory (mBIST). The semiconductor wafer may include scribe lines that connect certain terminals (e.g., contacts, pins, metal traces, etc.) of a semiconductor die to terminals of an adjacent semiconductor die. During the wafer-level testing, probe needles of a test setup may connect to a single one of the multiple adjacent semiconductor die, and mBIST commands may be passed from the single one of the multiple adjacent semiconductor die to one or more adjacent semiconductor die. In some examples, the scribe lines may connect mBIST circuit terminals of one semiconductor die to mBIST circuit terminals of an adjacent semiconductor die. In some examples, the scribe lines may connect I/O terminals of one semiconductor die to I/O terminals of an adjacent semiconductor die. The scribe lines may cross scribe regions (e.g., areas of a wafer between adjacent semiconductor die that are destroyed during a dicing operation to recover the individual semiconductor die) of the wafer to connect the respective terminals of the adjacent semiconductor die.

During a wafer-level test of the multiple semiconductor die, the tester may provide commands to one or more of the multiple semiconductor die. In one example (e.g., scribe lines and intra-die metal traces connect mBIST circuits of adjacent semiconductor die), the tester may provide test commands to a master semiconductor die of the multiple semiconductor die via the connected probe needles, and in response to the test commands, the mBIST circuit of the master semiconductor die may program mBIST circuits of slave semiconductor die of the multiple semiconductor die to perform one or more self tests and to provide self-test results back to the mBIST circuit of the master semiconductor die. The mBIST circuit of the master semiconductor die may report self-test results of each of the multiple semiconductor die back to the tester.

In another example (e.g., scribe lines and intra-die metal traces connect I/Os of adjacent semiconductor die), the tester may provide individual test commands that directed to a respective semiconductor die of the multiple semiconductor die. In response to the individual test comments, the mBIST circuit of the respective semiconductor die may perform one or more self tests and provide self-test results back to tester via the I/Os. Because the I/O terminals of the multiple semiconductor die are interconnected via the scribe lines, the multiple semiconductor die may share common I/O buses (e.g., command, address, dock, data, etc.). To avoid more than one of the multiple semiconductor die communicating on a bus contemporaneously, the tester may provide test commands that include an identifier to indicate a target one of the multiple semiconductor die, such as a chip select signal CS or clock enable signal CKE being enabled. Using the scribe lines to interconnect multiple semiconductor die during wafer-level testing may simplify test setup and may reduce wafer-level test time.

Additionally or alternatively to the mBIST circuit scribe line interconnects and/or the I/O scribe line interconnects, the wafer may include respective supplemental mBIST circuitry formed in the scribe region that is connected to the mBIST circuit of one of the semiconductor die of the wafer via additional scribe lines to facilitate additional or different self-test operations during wafer level testing. The additional mBIST circuitry may provide additional throughput to decrease self-test time, may provide additional functionality to support operations of a master mBIST circuit, may provide functionality to support wafer-level tests that are different than in-service or operation tests after packaging, etc., or any combination thereof. The supplemental mBIST circuitry may be formed for each semiconductor die of the wafer or a particular subset of the semiconductor die of the wafer (e.g., to support the master mBIST circuit operation). The supplemental mBIST circuitry may improve wafer-level testing by making it more efficient, more thorough, or any combination thereof.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

FIG. 1 is a schematic block diagram of a semiconductor die (or device) 100, in accordance with an embodiment of the present disclosure. For example, the semiconductor die 100 a clock input circuit 105, an internal clock generator 107, an address command input circuit 115, an address decoder 120, a command decoder 125, a plurality of row decoders 130, a memory cell array 145 including sense amplifiers 150 and transfer gates 195, a plurality of column decoders 140, a plurality of read/write amplifiers 165, an input/output (I/O) circuit 170, a mBIST circuit 180, a compression circuit 182, and a voltage generator 190. The semiconductor die 100 may include a plurality of external terminals including address and command terminals coupled to command/address bus 110 (e.g., command/address terminals C/A, clock terminals CLK, clock enable and/or chip select terminals CKE/CS, test probe terminals PROBE, etc.); clock terminals CK and/CK; data terminals DQ, DQS, and DM; and power supply, terminals VDD, VSS, VDDQ, and VSSQ.

The memory cell array 145 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal to the row decoder 130 and the column decoder 140, in some examples.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line, enable signals, such as the CKE or CS signals. Signals provided on the command/address bus 110 may be clocked via the CLK signal.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the JO circuit 170. The IO circuit 170 may provide the read data. DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor die 100, the clock terminals CK and/CK may receive an external clock signal and a complementary external clock signal, respectively. The external clock signals (including complementary external clock signal) may be supplied to a clock input circuit 105. The clock input circuit 105 may receive the external clock signals and generate an internal clock signal LCLK. The clock input circuit 105 may provide the internal clock signal ICLK to an internal clock generator 107 and to the mBIST circuit 180. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS.

These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the 10 circuit 170.

The mBIST circuit 180 and the compression circuit 182 may be configured to facilitate self-testing of the semiconductor die 100, including a self-test of the memory cell array 145 to detect defects. The mBIST circuit 180 may receive commands via the command/address bus 110, and may perform self-test operations in response to the commands.

The commands may direct the mBIST circuit 180 to conduct a self-test of some portion of or all of the memory cell array 145, in some examples. The self-test operations may exercise circuitry of the semiconductor die 100 to detect defects or abnormal behavior. During a self-test operation of the memory cell array 145, the mBIST circuit 180 may detect defects in the memory cell array 145 by causing data to be written to memory cells of the memory cell array 145, and then causing data to be read from the memory cells of the memory cell array 145 to determine whether the read data matches the written data. The mBIST circuit 180 may provide mBIST write data to the IO circuit 170, a mBIST LCLK (e.g., based on the ICLK signal) to various circuit components that rely on the LCLK for operation, mBIST commands and addresses (C/A) to the command decoder 125 and the address decoder 120, respectively, or any combination thereof. The mBIST write data may be generated by the mBIST circuit 180 or may be received from the tester or from some other source (e.g., such as another mBIST circuit). The mBIST C/As may cause the mBIST write data to be written to the memory cell array 145 at particular memory cells. The compression circuit 182 is configured to compress read data read from the memory cell array 145 during self-test operations of the memory cell array 145 by providing a read flag that indicates whether the read data included an error. That is, the compression circuit 182 may detect mismatches between the read data and the write data, which may indicate a defect in a respective cell of the memory cell array 145. To provide the read flag, the compression circuit 182 may perform logical comparisons between bits of the read data read from the memory cell array 145 to detect errors, and set a value of the read flag that indicates whether the read data included any errors. The mBIST circuit 180 may provide the read flag to an output of the semiconductor device (e.g., to the DQ terminals via the 10 circuit 170), in some examples.

During production, the semiconductor die 100 may be formed on a wafer (not shown) with multiple other similar semiconductor die. While still part of the wafer, the multiple semiconductor die may be tested in order to detect production defects. In some examples, during wafer-level testing (e.g., prior to dicing the wafer in to the individual semiconductor die), the semiconductor die 100 may be tested contemporaneously (e.g., in parallel with) with one or more physically-adjacent semiconductor devices (e.g., devices or units under test (DUTs)) on the wafer using the mBIST circuit 180.

To support the parallel testing, the wafer may include scribe lines that connect certain terminals (e.g., contacts, pins, metal traces, etc.) of the semiconductor die 100 to terminals of an adjacent semiconductor die. During the wafer-level testing, probe needles of a test setup may only physically connect to I/O contacts or terminals (e.g., DQ/DQS/DM terminals, C/A terminals, CK terminals, etc., or any combination thereof) of a single one of the multiple adjacent semiconductor die, and mBIST commands from the tester may be passed from the single one of the multiple adjacent semiconductor die to one or more adjacent semiconductor die via the scribe lines and intra-die metal traces. The scribe lines may cross scribe regions (e.g., areas of a wafer between adjacent semiconductor die that are destroyed during a dicing operation to recover the individual semiconductor die) of the wafer to connect the respective terminals of the adjacent semiconductor die. Some other terminals (e.g., power or VDD/VSS terminals, etc.) of the multiple adjacent semiconductor die may each be connected to respective probe needles of the test setup.

In some examples, the scribe lines and intra-die metal traces may form an mBIST-to-mBIST link to physically connect the mBIST circuit 180 to an mBIST of an adjacent semiconductor die in order to communicate mBIST commands, write data, test results, or any combination thereof between the mBIST circuits. In this example, the tester may provide a respective master/slave signal to each of the multiple adjacent semiconductor die. In some examples, the master/slave signal may use a clock enable CKE terminal or a chip select (CS) terminal. The semiconductor die multiple adjacent semiconductor die that is identified as the master may be the single one of the multiple adjacent semiconductor die to which the probe needles are connected. The other semiconductor die of the multiple adjacent semiconductor die may be identified as slave semiconductor die. Thus, in some examples, the semiconductor die 100 may be a master when IO terminals are connected to probe needles of the test setup, and may be a slave when the probe needles are connected to IO terminals of another semiconductor die. During a wafer-level test of the multiple semiconductor die, the tester may provide commands, addresses, clock signals, etc., to the master semiconductor die via the connected probe needles, and in response to the commands, addresses, clock signals, etc., the mBIST circuit mBIST circuit 180 of the master semiconductor die may provide command, addresses, clock signals, write data, or any combination thereof to the mBIST circuits of the slave semiconductor die via the mBIST-to-mBIST link to cause the slave mBIST circuits to perform one or more respective self tests and to provide self-test results back to the mBIST circuit mBIST circuit 180 of the master semiconductor die 100. The mBIST circuit mBIST circuit 180 of the master semiconductor die may report self-test results of each of the multiple semiconductor die back to the tester.

In another example, the scribe lines may connect the K) terminals (e.g., the C/A terminals, the DQ/DQS/DM terminals, the CK and/CK terminals, or any combination thereof) of one semiconductor die to I/O terminals of one or more adjacent semiconductor die. In this example, the tester may provide individual test commands, addresses, clock signals, etc., that are directed to a respective semiconductor die of the multiple adjacent semiconductor die. In response to the individual test commands, addresses, clock signals, etc., the mBIST circuit mBIST circuit 180 of the respective semiconductor die may perform one or more self tests and provide self-test results back to tester via the IO terminals (e.g., the DQ/DQS/DM terminals). Because the IO terminals of the multiple semiconductor die are interconnected via the scribe lines, the multiple semiconductor die may share common IO buses (e.g., command, address, clock, data, etc.). To avoid more than one of the multiple semiconductor die communicating on a particular bus contemporaneously, the tester may provide test commands that include an identifier to indicate a target one of the multiple semiconductor die, such as a chip select signal CS or clock enable signal CKE being enabled. The scribe lines are configured to be severed/destroyed when the wafer is diced to recover the semiconductor die 100, with only intra-die metal traces stubs extending to an edge surface of the semiconductor die 100. Using the scribe lines to interconnect multiple semiconductor die during wafer-level testing may simplify test setup and may reduce wafer-level test time.

Additionally or alternatively to the mBIST-to-mBIST link scribe line interconnects and/or the I/O scribe line interconnects, the mBIST circuit 180 may be connected to respective supplemental mBIST circuitry (not shown) formed in a scribe region of the wafer via respective scribe lines. The supplemental mBIST circuitry may facilitate additional or different self-test operations during wafer level testing. The additional mBIST circuitry may provide additional throughput to decrease self-test time, may provide additional functionality to support operations of a master mBIST circuit mBIST circuit 180, may provide functionality to support wafer-level tests that are different than in-service or operation tests after packaging, etc., or any combination thereof. The supplemental mBIST circuitry may be formed for each semiconductor die of the wafer or a particular subset of the semiconductor die of the wafer (e.g., to support the master mBIST circuit operation). The scribe line interconnects and the supplemental mBIST circuitry are configured to be severed/destroyed when the wafer is diced to recover the semiconductor die 100, with only scribe line stubs left on the semiconductor die 100. The supplemental mBIST circuitry may improve wafer-level testing by making it more efficient, more thorough, or any combination thereof.

Figure 2:
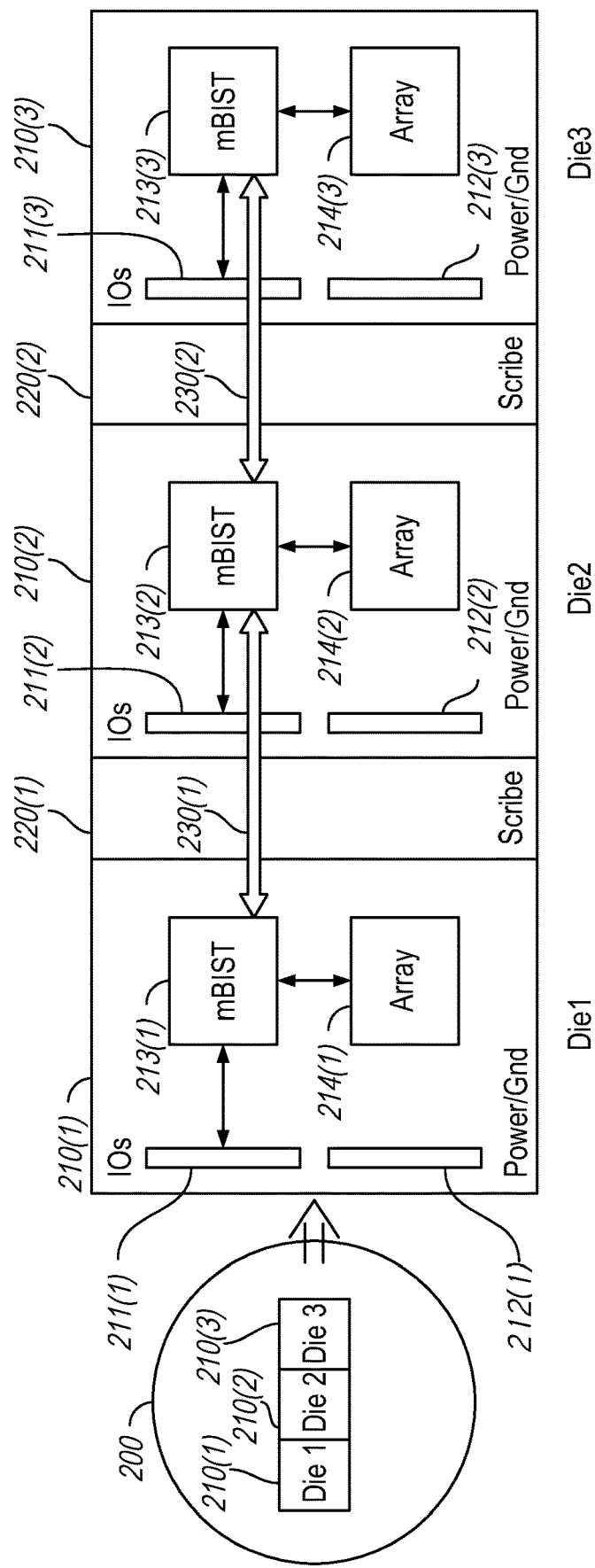
FIG. 2 is a diagram of a wafer that include semiconductor die, in accordance with an embodiment of the present disclosure.

FIG. 2 is a diagram of a wafer 200 that include semiconductor die 210(1)-(3), in accordance with an embodiment of the present disclosure. The wafer 200 may include a scribe region 220(1) formed between the semiconductor die 210(1) and the semiconductor die 210(2), and a scribe region 220(2) formed between the semiconductor die 210(2) and the semiconductor die 210(3). The semiconductor die 100 of FIG. 1 may implement any of the semiconductor die 210(1)-(3), in some examples.

Each of the semiconductor die 210(1)-(3) may include a respective set of IO terminals/circuits 211(1)-(3), a respective set of power terminals/circuits 212(1)-(3), a respective mBIST circuit 213(1)-(3), and a respective memory cell array 214(1)-(3). Operation of the memory cell array 214(1)-(3) may be as described with reference to the memory cell array 145 of FIG. 1. For clarity, additional circuit components are omitted from each of the semiconductor die 210(1)-(3) depicted in FIG. 2. It is appreciated that the semiconductor die 210(1)-(3) may include this omitted circuitry, such as some or all of the circuit components depicted with reference to the semiconductor die 100 of FIG. 1, without departing from the scope of the disclosure.

During production, the semiconductor die 210(1)-(3) may be formed on the wafer 200. While still part of the wafer 200, the semiconductor die 210(1)-(3) may be tested while still part of the wafer 200 in order to detect production defects. In some examples, during wafer-level testing (e.g., prior to dicing the wafer 200 to separate the semiconductor die 210(1)-(3)), the semiconductor die 210(1)-(3) may be tested contemporaneously (e.g., in parallel with) with each other using the respective mBIST circuit 213(1)-(3).

To support the parallel testing, scribe lines 230(1) and 230(2) may be formed on the wafer 200 that connect certain contacts or terminals of one of the semiconductor die 210(1)-(3) to terminals (e.g., contacts, pins, etc.) of an adjacent semiconductor die. The scribe line 230(1) may cross the scribe region 220(1) and the scribe line 230(2) may cross the scribe region 220(2). For example, the scribe line 230(1) may connect terminals of the mBIST circuit 213(1) to terminals of the mBIST circuit 213(2) to form a first mBIST-to-mBIST link and the scribe line 230(2) may connect terminals of the mBIST circuit 213(2) to terminals of the mBIST circuit 213(3) to form a second mBIST-to-mBIST link. The scribe regions 220(1) and 220(2) may be areas of the wafer 200 that are destroyed during a dicing operation to separate the semiconductor die 210(1)-(3) into individual parts. When the wafer 200 is diced, stubs from the 230(1) and/or the 230(2) may remain on one or more of the semiconductor die 210(1)-(3).

During a wafer-level test, the tester may identify the semiconductor die 210(2) as the master, and may identify each of the semiconductor die 210(1) and the semiconductor die 210(3) as slaves. Probe needles of a test setup may only physically connect to the IO terminals/circuits 211(2) (e.g., DQ/DQS/DM terminals, C/A terminals, CK terminals, etc., or any combination thereof) of the semiconductor die 210(2) to facilitate communication of commands, addresses, clock signals, test results, etc. In response to the commands, addresses, clock signals, etc., from the tester, the mBIST circuit 213(2) may perform self-test operations and may provide results back to the tester.

In addition, in response to the commands, addresses, clock signals, etc., from the tester, the mBIST circuit 213(2) may communicate respective commands, addresses, clock signals, write data, or any combination thereof to the mBIST circuit 213(1) via the 230(1) and to the mBIST circuit 213(3) via the 230(2). In response to the respective commands, addresses, clock signals, write data, or any combination thereof, each of the mBIST circuit 213(1) and the mBIST circuit 213(3) may perform self-test operations and provide results back to the mBIST circuit 213(2). The mBIST circuit 213(2) may provide the respective self-test results from the semiconductor die 210(1) and 210(3) back to the tester.

It is appreciated that the wafer 200 may include more or fewer than three semiconductor die. It is also appreciated that the mBIST circuit 213(2) may be connected to only one of the mBIST circuit 213(1) or the mBIST circuit 213(3), or may be connected to additional mBIST circuits of other semiconductor die. Using the scribe lines to interconnect multiple semiconductor die during wafer-level testing may simplify test setup and may reduce wafer-level test time.

Figure 3:
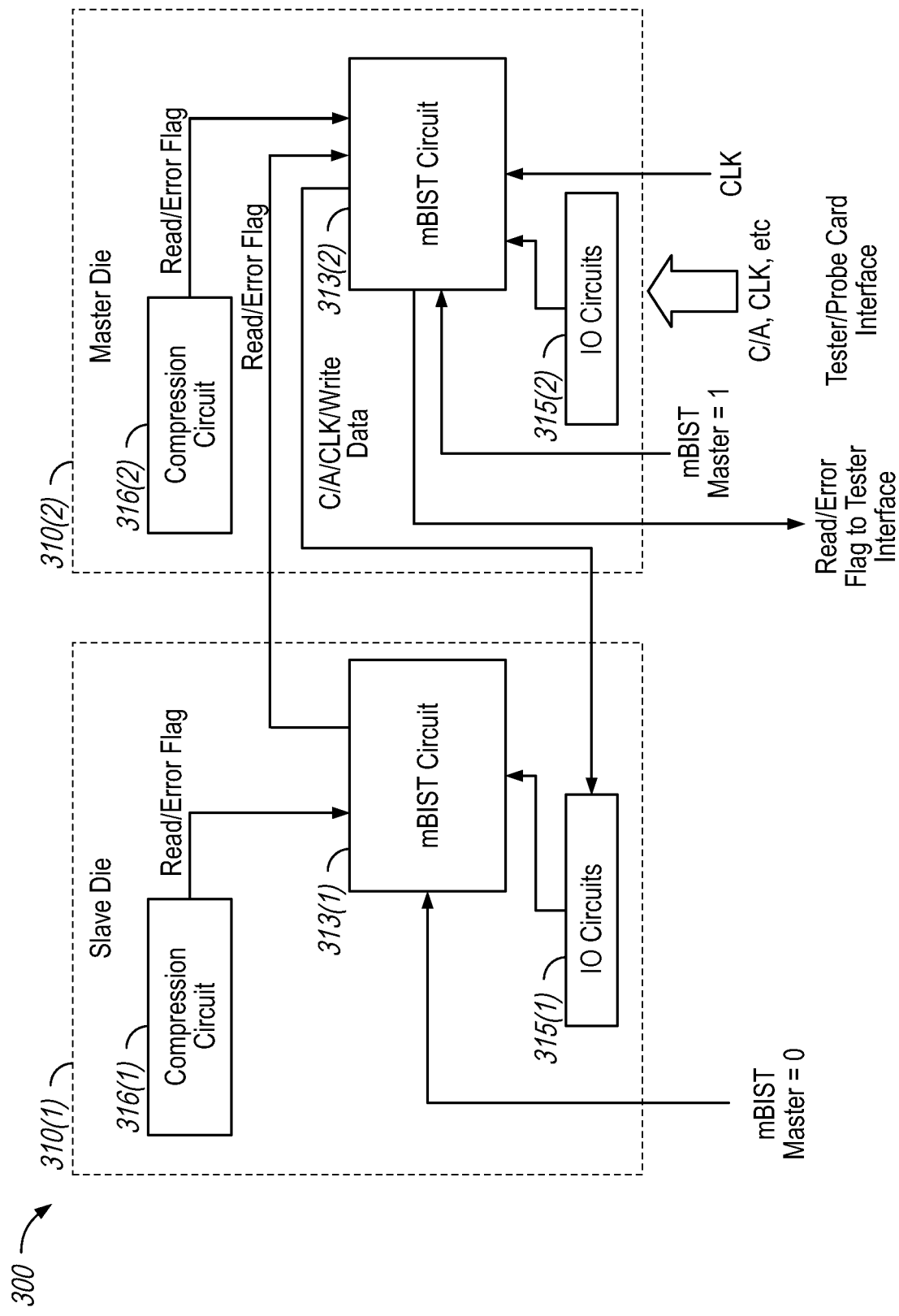
FIG. 3 is a block diagram of a wafer that include semiconductor die, in accordance with an embodiment of the present disclosure.

FIG. 3 is a block diagram of a wafer 300 that include semiconductor die 310(1)-(2), in accordance with an embodiment of the present disclosure. The semiconductor die 100 of FIG. 1 may implement any of the semiconductor die 310(1)-(2), in some examples. The semiconductor die 210(1) or 210(3) of FIG. 2 may implement the semiconductor die 310(1) and/or the semiconductor die 210(2) of FIG. 2 may implement the semiconductor die 310(2), in some examples.

Each of the semiconductor die 310(1)-(2) may include a respective mBIST circuit 313(1)-(2), respective IO circuits 315(1)-(2), and a respective compression circuit 316(1)-(2). For clarity, additional circuit components are omitted from each of the semiconductor die 310(1)-(2) depicted in FIG. 3. It is appreciated that the semiconductor die 310(1)-(2) may include this omitted circuitry, such as some or all of the circuit components depicted with reference the semiconductor die 100 to FIG. 1 and/or each of the semiconductor die 210(1)-(3) of FIG. 2, without departing from the scope of the disclosure.

During production, the semiconductor die 310(1)-(2) may be formed on the wafer 300. While still part of the wafer 300, the semiconductor die 310(1)-(2) may be tested while still part of the wafer 300 in order to detect production defects. In some examples, during wafer-level testing (e.g., prior to dicing the wafer 300 to separate the semiconductor die 310(1)-(2)), the semiconductor die 310(1)-(2) may be tested contemporaneously (e.g., in parallel with) with each other using the respective mBIST circuit 313(1)-(2).

To support the parallel testing, scribe lines may be formed on the wafer 300 that connect certain contacts or terminals of one of the semiconductor die 310(1)-(2) to terminals (e.g., contacts, pins, etc.) of an adjacent semiconductor die. For example, scribe lines may connect the mBIST circuit 213(2) of the semiconductor die 310(2) to the mBIST circuit 313(1)

and the IO circuits 315(1) of the semiconductor die 310(1) to form an mBIST-to-mBIST link.

During a wafer-level test, the tester may identify the semiconductor die 310(2) as the master via a master/slave signal, and may identify the semiconductor die 310(1) as slaves via the master/slave signal. In some examples, the tester may set one of the respective CKE or CS signals for each of the semiconductor die 310(1)-(2) to indicate master/slave, and the mBIST circuit 313(1) and the mBIST circuit 313(2) may read the respective one of the CKE or CS signal to determine master or slave status. Probe needles of a test setup may only physically connect to the IO circuits 315(2) (e.g., via DQ/DQS/DM terminals, C/A terminals, CK terminals, etc., or any combination thereof) of the semiconductor die 310(2) to facilitate communication of commands, addresses, clock signals, test results, etc. The IQ circuits 315(2) of the semiconductor die 310(2) may provide respective commands, addresses, clock signals, etc. to the mBIST circuit 313(1).

In response to the mBIST commands, write commands, etc., from the tester, the mBIST circuit 313(2) may perform self-test operations to test the memory cell array 314(2). The compression circuit 316(2) may compress read data from the self-test to set a respective read flag. The mBIST circuit 313(2) may provide results (e.g., a value of the read flag) back to the tester (e.g., directly or via DQ terminals).

In addition, in response to the mBIST commands, write commands, etc., from the tester, the mBIST circuit 313(2) may communicate respective commands, addresses, clock signals, write data, or any combination thereof, to the mBIST circuit 313(1) via the IO circuits 315(1). In response to the respective commands, addresses, clock signals, write data, or any combination thereof, the mBIST circuit 313(1) may perform self-test operations to test the memory cell array 314(1). The compression circuit 316(1) may compress read data from the self-test to set a respective read flag. The mBIST circuit 313(1) may provide results (e.g., a value of the respective read flag) back to the mBIST circuit 313(2) The mBIST circuit 313(2) may provide results (e.g., a value of the respective read flag) corresponding to the 310(1) back to the tester (e.g., directly or via DQ terminals).

It is appreciated that the wafer 300 may include more or fewer than two semiconductor die. It is also appreciated that the mBIST circuit 313(2) may be connected to additional mBIST circuits of other semiconductor die. Using the scribe lines to interconnect multiple semiconductor die during wafer-level testing may simplify test setup and may reduce wafer-level test time.

Figure 4:
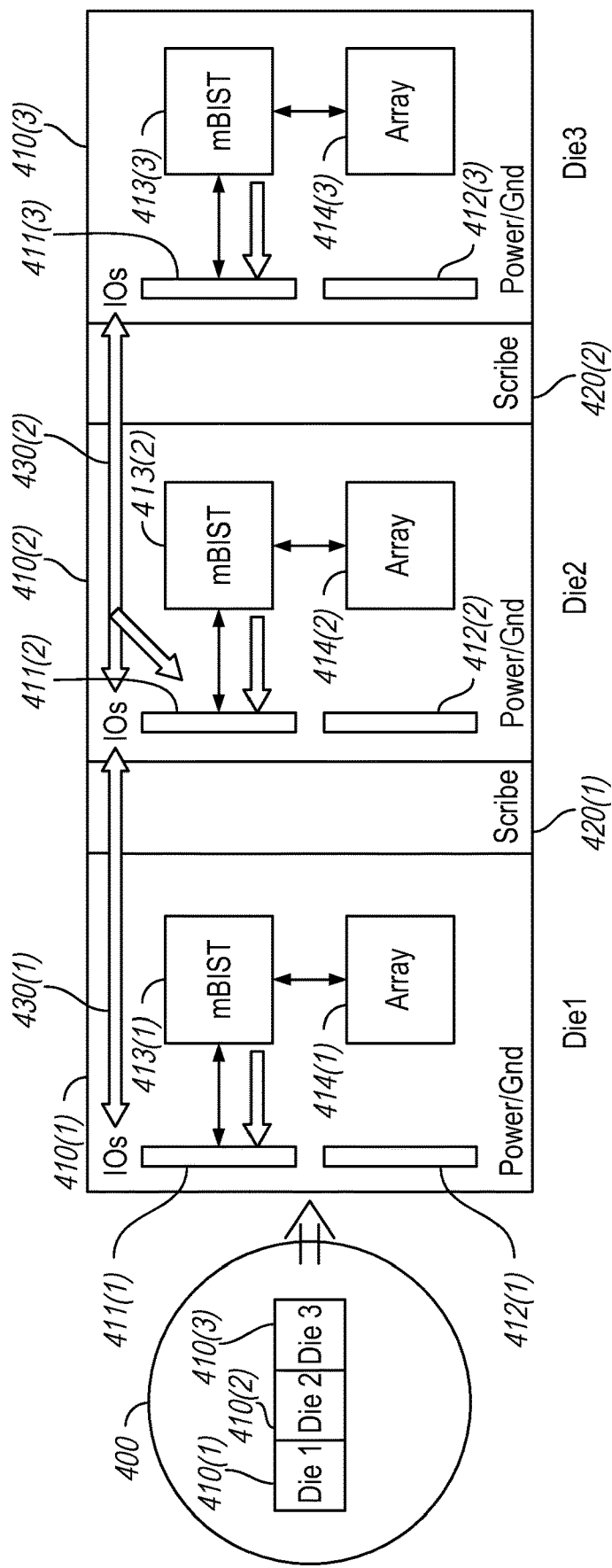
FIG. 4 is a diagram of a wafer that include semiconductor die, in accordance with an embodiment of the present disclosure.

FIG. 4 is a diagram of a wafer 400 that include semiconductor die 410(1)-(3), in accordance with an embodiment of the present disclosure. The wafer 400 may include a scribe region 420(1) formed between the semiconductor die 410(1) and the semiconductor die 410(2), and a scribe region 420(2) formed between the semiconductor die 410(2) and the semiconductor die 410(3). The semiconductor die 100 of FIG. 1 may implement any of the semiconductor die 410 (1)-(3), in some examples.

Each of the semiconductor die 410(1)-(3) may include a respective set of IO terminals/circuits 411(1)-(3), a respective set of power terminals/circuits 412(1)-(3), a respective mBIST circuit 413(1)-(3), and a respective memory cell array 414(1)-(3). Operation of the memory cell array 414 (1)-(3) may be as described with reference to the memory cell array 145 of FIG. 1. For clarity, additional circuit components are omitted from each of the semiconductor die 410(1)-(3) depicted in FIG. 4. It is appreciated that the semiconductor die 410(1)-(3) may include this omitted circuitry, such as some or all of the circuit components depicted with reference to the semiconductor die 100 of FIG. 1, without departing from the scope of the disclosure.

During production, the semiconductor die 410(1)-(3) may be formed on the wafer 400. While still part of the wafer 400, the semiconductor die 410(1)-(3) may be tested while still part of the wafer 400 in order to detect production defects. In some examples, during wafer-level testing (e.g., prior to dicing the wafer 400 to separate the semiconductor die 410(1)-(3)), the semiconductor die 410(1)-(3) may be tested contemporaneously (e.g., in parallel with) with each other using the respective mBIST circuit 413(1)-(3).

To support the parallel testing, scribe lines 430(1) and 430(2) may be formed on the wafer 400 that connect certain contacts or terminals of one of the semiconductor die 410(1)-(3) to terminals (e.g., contacts, pins, etc.) of an adjacent semiconductor die. The scribe line 430(1) may cross the scribe region 420(1) and the scribe line 430(2) may cross the scribe region 420(2). For example, the scribe line 430(1) may connect terminals of the IO terminals/circuits 411(1) to terminals of the IO terminals/circuits 411(2) and the scribe line 430(2) may connect terminals of the 10 terminals/circuits 411(2) to terminals of the IO terminals/circuits 411(3). The scribe regions 420(1) and 420(2) may be areas of the wafer 400 that are destroyed during a dicing operation to separate the semiconductor die 410(1)-(3) into individual parts. When the wafer 400 is diced, stubs from the 430(1) and/or the 430(2) may remain on one or more of the semiconductor die 410(1)-(3).

During a wafer-level test, probe needles of a test setup may only physically connect to the IO terminals/circuits 411(2) (e.g., DQ/DQS/DM terminals, C/A terminals, CK terminals, etc., or any combination thereof) of the semiconductor die 410(2) to facilitate communication of commands, addresses, clock signals, test results, etc. Because the IO terminals/circuits 411(2) is coupled to the 10 terminals/circuits 411(1) via the scribe line 430(1) and coupled to the JO terminals/circuits 411(3) via the scribe line 430(2), the tester may provide individual test commands, addresses, clock signals, etc., that are directed to a respective one of the semiconductor die 410(1)-(3). Because the IO terminals/circuits 411(1)-(3) are interconnected via the scribe lines 430(1) and 430(2), the semiconductor die 410(1)-(3) may share common IO buses (e.g., command, address, clock, data, etc.). To avoid more than one of the semiconductor die 410(1)-(3) communicating on a particular bus contemporaneously, the tester may provide test commands that include an identifier to indicate a target one of the multiple semiconductor die, such as a chip select signal CS or clock enable signal CKE being enabled. The tester may leverage one of the CKE or the CS signal to indicate a target of the individual test commands, addresses, clock signals, etc.

In response to the individual test commands, addresses, clock signals, etc., the respective mBIST circuit 413(1)-(3) may perform one or more self tests of the respective memory cell array 414(1)-(3) and provide self-test results back to tester via the respective IO terminals/circuits 411(1)-(3). The test results from the semiconductor device 410(2) may be provided to the tester directly from the IO terminals/circuits 411(2). The test results from the semiconductor device 410(1) may be provided to the tester from the IO terminals/circuits 411(1) via the scribe lines 430(1) and the IO terminals/circuits 411(2). The test results from the semiconductor device 410(3) may be provided to the tester from the IO terminals/circuits 411(3) via the scribe lines 430(2) and the IO terminals/circuits 411(2).

It is appreciated that the wafer 400 may include more or fewer than three semiconductor die. It is also appreciated that the IO terminals/circuits 411(2) may be connected to only one of the IO terminals/circuits 411(1) or the IO terminals/circuits 411(3), or may be connected to additional mBIST circuits of other semiconductor die. Using the scribe lines to interconnect multiple semiconductor die during wafer-level testing may simplify test setup and may reduce wafer-level test time.

Figure 5:
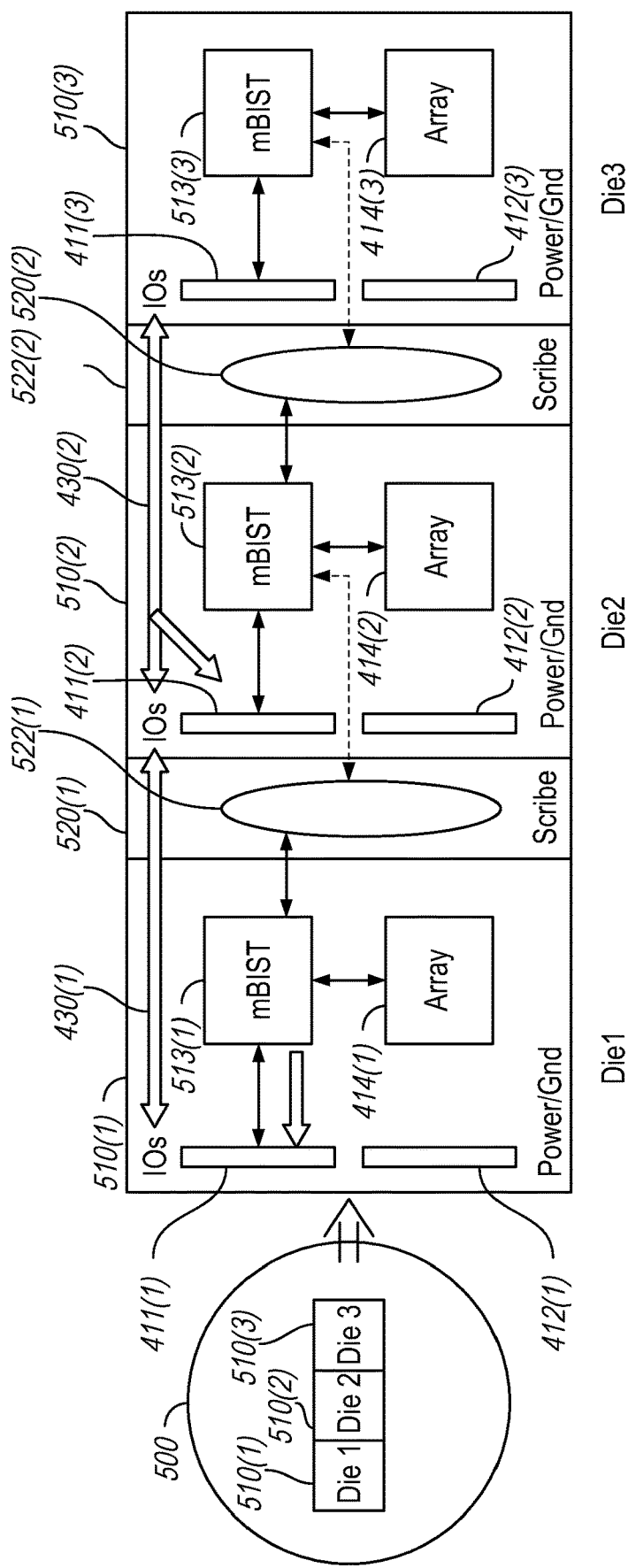
FIG. 5 is a diagram of a wafer that include semiconductor die, in accordance with an embodiment of the present disclosure.

FIG. 5 is a diagram of a wafer 500 that include semiconductor die 510(1)-(3), in accordance with an embodiment of the present disclosure. The wafer 500 may include a scribe region 520(1) formed between the semiconductor die 510(1) and the semiconductor die 510(2), and a scribe region 520(2) formed between the semiconductor die 510(2) and the semiconductor die 510(3). The semiconductor die 100 of FIG. 1 may implement any of the semiconductor die 510 (1)-(3), in some examples.

Each of the semiconductor die 510(1)-(3) may include a respective set of IO terminals/circuits 411(1)-(3), a respective set of power terminals/circuits 412(1)-(3), a respective mBIST circuit 513(1)-(3), and a respective memory cell array 414(1)-(3). Operation of the 514(1)-(3) may be as described with reference to the memory cell array 145 of FIG. 1. For clarity, additional circuit components are omitted from each of the semiconductor die 510(1)-(3) depicted in FIG. 5. It is appreciated that the semiconductor die 510(1)-(3) may include this omitted circuitry, such as some or all of the circuit components depicted with reference to the semiconductor die 100 of FIG. 1, without departing from the scope of the disclosure. The semiconductor die 510(1)-(3) may include elements that have been previously described with respect to the semiconductor die 410(1)-(3) of FIG. 4. Those elements have been identified in FIG. 5 using the same reference numbers used in FIG. 4 and operation of the common elements is as previously described. Consequently, a detailed description of the operation of these particular elements will not be repeated in the interest of brevity.

During production, the semiconductor die 510(1)-(3) may be formed on the wafer 500. In addition, supplemental mBIST circuit 522(1) may be formed in the scribe region 520(1) and supplemental mBIST circuit 522(2) may be formed in the scribe region 520(2). The supplemental mBIST circuit 522(1) may be connected to the mBIST circuit 513(1) and/or the mBIST circuit 513(2) via respective scribe lines and the supplemental mBIST circuit 522(2) may be connected to the mBIST circuit 513(2) and/or the mBIST circuit 513(3) via respective scribe lines. The supplemental mBIST circuit 522(1) and the supplemental mBIST circuit 522(2) may facilitate additional or different self-test operations during wafer level testing. The supplemental mBIST circuit 522(1) and the supplemental mBIST circuit 522(2) may provide additional throughput to decrease self-test time (e.g., more self-test loops, increase parallel processing, etc.) may provide additional functionality to support different operations (e.g., such as to support operations of a master mBIST circuit described with respect to the embodiment of FIGS. 2 and 3), may provide functionality to support wafer-level tests that are different than in-service or operation tests after packaging, etc., or any combination thereof. The supplemental mBIST circuit 522(1) and the supplemental mBIST circuit 522(2) may be formed for each semiconductor die 510(1)-(3) of the wafer 500 or a particular subset of semiconductor die of the wafer 500 (e.g., to support the master mBIST circuit operation). The supplemental mBIST circuit 522(1) and the supplemental mBIST circuit 522(2) may improve wafer-level testing by making it more efficient, more thorough, or any combination thereof. The scribe regions 520(1) and 520(2) may be areas of the wafer 500 that are destroyed during a dicing operation to separate the semiconductor die 510(1)-(3) into individual parts. When the wafer 500 is diced, stubs from scribe lines connecting the semiconductor die 510(1)-(3) to the supplemental mBIST circuit 522(1) and/or the supplemental mBIST circuit 522(2) may remain on one or more of the semiconductor die 510(1)-(3).

During a wafer-level test, probe needles of a test setup may physically connect to at least one of the 511(1)-(3) to facilitate communication of commands, addresses, clock signals, test results, etc.

In response to the individual test commands, addresses, clock signals, etc., the respective mBIST circuit 513(1)-(3) may perform one or more self tests of the respective 515 (1)-(3) and provide self-test results back to tester via the respective 511(1)-(3). The mBIST circuit 513(1) and/or the mBIST circuit 513(2) may use the supplemental mBIST circuit 522(1) to perform at least part of the self-test operations and the mBIST circuit 513(2) and/or the mBIST circuit 513(3) may use the supplemental mBIST circuit 522(2) to perform at least part of the self-test operations. The test results from the semiconductor device 510(2) may be provided to the tester directly from the 511(2). The test results from the semiconductor device 510(1) may be provided to the tester from the 511(1) via the scribe lines 530(1) and the 511(2). The test results from the semiconductor device 510(3) may be provided to the tester from the 511(3) via the scribe lines 530(2) and the 511(2).

It is appreciated that the wafer 500 may include more or fewer than three semiconductor die. It is also appreciated that the supplemental mBIST circuit 522(1 and/or the supplemental mBIST circuit 522(2) may be implemented in the scribe region 220(1) and/or the scribe region 220(2) of FIG. 2 to supplement self-test operations as described.

Figure 6:
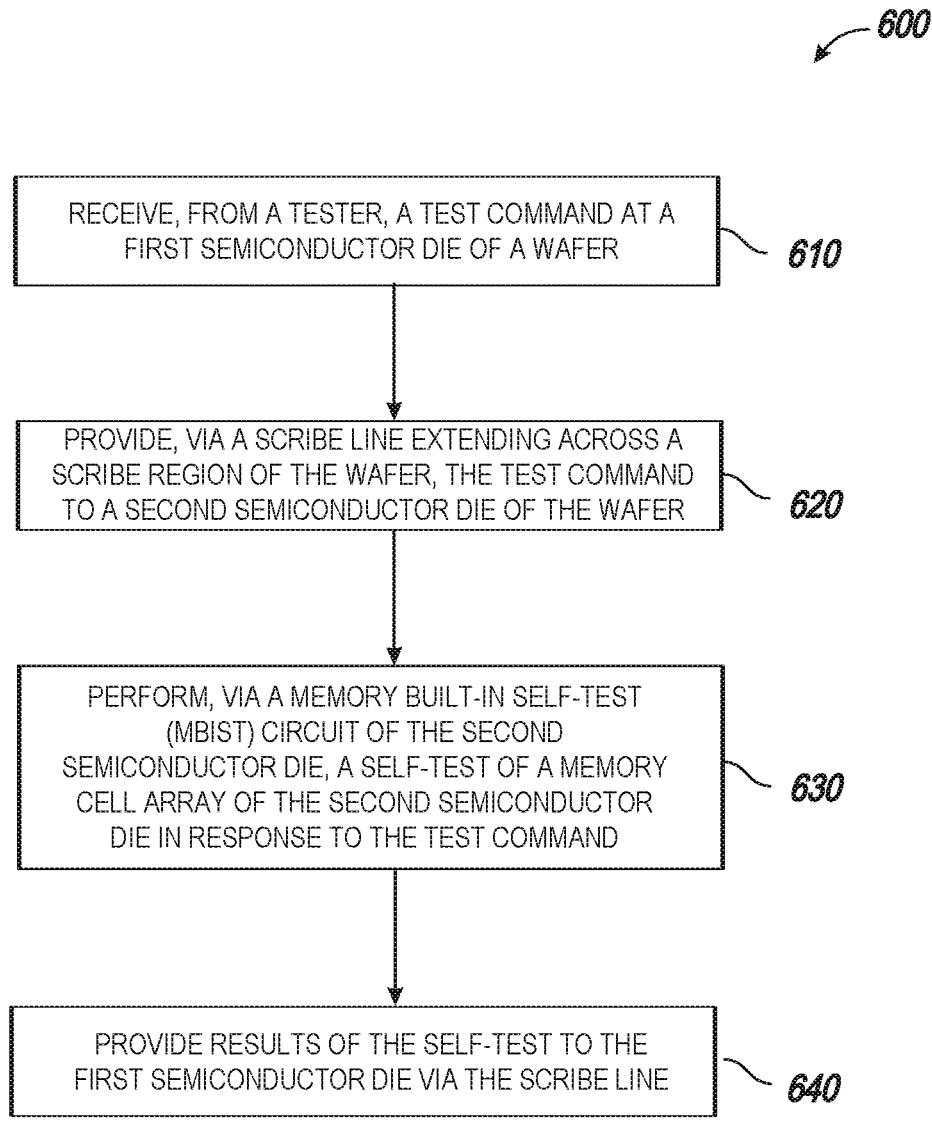
FIG. 6 is a flow diagram illustrating a method to perform a wafer-level self-test, in accordance with an embodiment of the present disclosure.

FIG. 6 is a flow diagram illustrating a method 600 to perform a wafer-level self-test, in accordance with an embodiment of the present disclosure. The method 600 may be performed using part or all of the semiconductor die 100 of FIG. 1, the wafer 200 of FIG. 2, the wafer 300 of FIG. 3, the wafer 400 of FIG. 4, the wafer 500 of FIG. 5, or any combination thereof.

The method 600 may include receiving, from a tester, a test command at a first semiconductor die of a wafer, at 610. The first semiconductor die may include the semiconductor die 100 of FIG. 1, the semiconductor die 210(2) of FIG. 2, the semiconductor die 310(2) of FIG. 3, the semiconductor die 410(2) of FIG. 4, the semiconductor die 510(2) of FIG. 5, or any combination thereof. In some examples, the method 600 may further include receiving, from the tester, an indication that the first semiconductor die is a master and the second semiconductor die is a slave (e.g., via a CKE or CS signal).

The method 600 may further include providing, via a scribe line extending across a scribe region of the wafer, the test command to a second semiconductor die of the wafer, at 620. The scribe line may include the 230(1) or the 230(2) of FIG. 2, the 430(1) or the 430(2) of FIGS. 4 and 5. The second semiconductor die may include the semiconductor die 100 of FIG. 1, the semiconductor die 210(1) or the semiconductor die 210(3) of FIG. 2, the semiconductor die 310(1) of FIG. 3, the semiconductor die 410(1) or the semiconductor die 410(3) of FIG. 4, the semiconductor die 510(1) or the semiconductor die 510(3) of FIG. 5, or any combination thereof.

The method 600 may further include performing, via a memory built-in self-test (mBIST) circuit of the second semiconductor die, a self-test of a memory cell array of the second semiconductor die in response to the test command, at 630. The mBIST circuit may include the mBIST circuit 180 of FIG. 1, the mBIST circuit 213(1) or the mBIST circuit 213(3) of FIG. 2, the mBIST circuit 313(1) of FIG. 3, the mBIST circuit 413(1) or the mBIST circuit 413(3) of FIG. 4, the mBIST circuit 513(1) or the mBIST circuit 513(3) of FIG. 5, or any combination thereof. In some examples, the method 600 may further include using, by the mBIST of the second semiconductor die, a supplemental mBIST circuit formed in a scribe region of the wafer to assist performance of the self-test of the memory cell array. The supplemental mBIST circuit may include the supplemental mBIST circuit 522(1) or the supplemental mBIST circuit 522(2) of FIG. 5.

The method 600 may further include providing results of the self-test to the first semiconductor die via the scribe line, at 640. In some examples, the method 600 may further include providing the results of the self-test to the tester. In some examples, the method 600 may further include receiving, from the tester, a second test command at the first semiconductor die of a wafer, and performing, via a second mBIST circuit of the first semiconductor die, a self-test of a memory cell array of the first semiconductor die in response to the second test command. The second mBIST circuit may include the mBIST circuit 180 of FIG. 1, the mBIST circuit 213(2) of FIG. 2, the mBIST circuit 313(2) of FIG. 3, the mBIST circuit 413(2) of FIG. 4, the mBIST circuit 513(2) of FIG. 5, or any combination thereof.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
   a first semiconductor die comprising a first memory cell array and a first memory built-in self-test (mBIST) circuit configured to receive a first test command and to perform a self-test of the first memory cell array in response to the first test command;
   a second semiconductor die comprising a second memory cell array and a second mBIST circuit configured to receive a second test command and perform a self-test of the second memory cell array in response to the second test command; and
   a scribe line configured to couple to the first semiconductor die to the second semiconductor die, wherein the first test command is initially received at the second semiconductor die and is provided from the second semiconductor die to the first semiconductor die via the scribe line.

2. The apparatus of claim 1, wherein the scribe line is configured to connect the first semiconductor die to the second mBIST circuit, wherein the second mBIST circuit is configured to provide the first test command to the first semiconductor die via the scribe line in response to receipt of a command from a tester.

3. The apparatus of claim 2, wherein the first mBIST circuit is configured to provide first results of the self-test of the first memory cell array to the second mBIST circuit via the scribe line, wherein the second semiconductor die is configured to provide the first results to the tester.

4. The apparatus of claim 2, wherein the first semiconductor die is configured as a slave semiconductor die and the second semiconductor die is configured as a master semiconductor die.

5. The apparatus of claim 1, wherein the scribe line is configured to connect input/output (I/O) terminals of the first semiconductor die to the I/O terminals of the second semiconductor die, wherein the I/O terminals of the second semiconductor die are configured to provide the first test command to the first semiconductor die via the scribe line.

6. The apparatus of claim 5, wherein the first test command includes an identifier indicating the first semiconductor die.

7. The apparatus of claim 1, further comprising a scribe region positioned between the first semiconductor die and the second semiconductor die, wherein the scribe line extends across the scribe region from the first semiconductor die to the second semiconductor die.

8. The apparatus of claim 7, further comprising a wafer that includes the first semiconductor die, the second semiconductor die, the scribe region, and the scribe line.

9. The apparatus of claim 8, wherein the scribe line and the scribe region are configured to be destroyed when the wafer is diced.

10. The apparatus of claim 7, further comprising a supplemental mBIST circuit formed in the scribe region, wherein the first mBIST circuit or the second mBIST circuit are coupled to the supplemental mBIST circuit to support the self-test of the first memory array or the self-test of the second memory array, respectively.

11. A semiconductor die comprising:
    an edge of the semiconductor die formed when the semiconductor die is cut from a wafer;
    a memory cell array formed on the semiconductor die and comprising a plurality of memory cells;
    a memory built-in self-test (mBIST) circuit formed on the semiconductor die configured to receive a test command and to perform a self-test of the memory cell array in response to the test command; and
    a metal trace line connected to the mBIST circuit and routed to the edge of the semiconductor die, wherein the mBIST circuit is configurable to communicate with a supplemental mBIST circuit via the metal trace line to support supplemental testing.

12. A method comprising:
    receiving, from a tester, a test command at a first semiconductor die of a wafer;
    providing, via a scribe line extending across a scribe region of the wafer, the test command to a second semiconductor die of the wafer;
    performing, via a memory built-in self-test (mBIST) circuit of the second semiconductor die, a self-test of a memory cell array of the second semiconductor die in response to the test command; and
    providing results of the self-test to the first semiconductor die via the scribe line.

13. The method of claim 12, further comprising:
receiving, from the tester, a second test command at the first semiconductor die of a wafer; and
performing, via a second mBIST circuit of the first semiconductor die, a self-test of a memory cell array of the first semiconductor die in response to the second test command.

14. The method of claim 12, further comprising providing the results of the self-test to the tester.

15. The method of claim 12, further comprising receiving, from the tester, an indication that the first semiconductor die is a master and the second semiconductor die is a slave.

16. The method of claim 12, further comprising using, by the mBIST circuit of the second semiconductor die, a supplemental mBIST circuit formed in a scribe region of the wafer to assist performance of the self-test of the memory cell array.

17. A method comprising:
receiving a test command at a semiconductor die via a memory built-in self-test (mBIST) circuit of the semiconductor die, via an mBIST-mBIST link formed in part by a metal trace extending to an edge of the semiconductor die;
performing, via the mBIST circuit, a self-test of a memory cell array of the semiconductor die in response to the test command; and
providing the test results to the metal trace.

18. A semiconductor die comprising:
an edge of the semiconductor die formed when the semiconductor die is cut from a wafer;
a memory cell array formed on the semiconductor die and comprising a plurality of memory cells;
a memory built-in self-test (mBIST) circuit formed on the semiconductor die configured to receive a test command and to perform a self-test of the memory cell array in response to the test command; and
a metal trace line connected to the mBIST circuit and routed to the edge of the semiconductor die, wherein the mBIST circuit is configurable to provide an mBIST-to-mBIST link to another mBIST circuit via the metal trace line.

19. A semiconductor die comprising:
an edge of the semiconductor die formed when the semiconductor die is cut from a wafer;
a memory cell array formed on the semiconductor die and comprising a plurality of memory cells;
a memory built-in self-test (mBIST) circuit formed on the semiconductor die configured to receive a test command and to perform a self-test of the memory cell array in response to the test command;
a metal trace line connected to the mBIST circuit and routed to the edge of the semiconductor die; and
a compression circuit configured to provide a read flag to the mBIST circuit that indicates whether the self-test is passed or failed.

20. A method comprising:
receiving a test command at a semiconductor die via a memory built-in self-test (mBIST) circuit of the semiconductor die from a supplemental mBIST circuit of the semiconductor die coupled to a metal trace extending to an edge of the semiconductor die;
performing, via the mBIST circuit of the semiconductor die, a self-test of a memory cell array of the semiconductor die in response to the test command; and
providing the test results to the metal trace.

* * * * *